United States Patent
Kil et al.

(10) Patent No.: US 7,616,426 B2
(45) Date of Patent: *Nov. 10, 2009

(54) CAPACITOR AND METHOD FOR FABRICATING THE SAME

(75) Inventors: Deok-Sin Kil, Kyoungki-do (KR);
Han-Sang Song, Kyoungki-do (KR);
Seung-Jin Yeom, Kyoungki-do (KR);
Ki-Seon Park, Kyoungki-do (KR);
Jae-Sung Roh, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 262 days.

This patent is subject to a terminal disclaimer.

(21) Appl. No.: 11/595,548

(22) Filed: Nov. 10, 2006

(65) Prior Publication Data

US 2007/0102742 A1    May 10, 2007

(30) Foreign Application Priority Data

Nov. 10, 2005  (KR)  ............... 10-2005-0107399

(51) Int. Cl.
*H01G 4/06* (2006.01)
(52) U.S. Cl. ............... 361/313; 361/311; 361/301.4; 361/321.2; 361/321.4; 361/306.1
(58) Field of Classification Search ................. 361/311, 361/313, 301.4, 301.1, 303–305, 321.1, 321.2, 361/306.1, 306.3; 257/295, 296
See application file for complete search history.

(56) References Cited

U.S. PATENT DOCUMENTS

| | | | | |
|---|---|---|---|---|
| 5,335,138 A | * | 8/1994 | Sandhu et al. | 361/303 |
| 5,555,486 A | * | 9/1996 | Kingon et al. | 361/305 |
| 6,300,216 B1 | * | 10/2001 | Shan | 438/396 |
| 6,753,224 B1 | | 6/2004 | Lin et al. | |
| 2002/0153579 A1 | * | 10/2002 | Yamamoto | 257/412 |
| 2006/0097305 A1 | * | 5/2006 | Lee | 257/310 |

FOREIGN PATENT DOCUMENTS

| | | |
|---|---|---|
| KR | 10-0493040 | 5/2005 |
| KR | 10-2005-0062132 | 6/2005 |
| KR | 10-2005-0067577 | 7/2005 |
| KR | 10-0538805 | 12/2005 |

* cited by examiner

*Primary Examiner*—Nguyen T Ha
(74) *Attorney, Agent, or Firm*—Blakely Sokoloff Taylor & Zafman

(57) ABSTRACT

A capacitor includes a lower electrode, a dielectric structure over the lower electrode, the dielectric structure including at least one crystallized zirconium oxide ($ZrO_2$) layer and at least one amorphous aluminum oxide ($Al_2O_3$) layer, and an upper electrode formed over the dielectric structure. A method for fabricating a capacitor includes forming a lower electrode over a certain structure, forming a dielectric structure including at least one crystallized zirconium oxide ($ZrO_2$) layer and at least one amorphous aluminum oxide ($Al_2O_3$) layer over the lower electrode, and forming an upper electrode over the dielectric structure.

32 Claims, 11 Drawing Sheets

LENGTH    LENGTH

CAPACITOR AND METHOD FOR FABRICATING THE SAME

CROSS-REFERENCE TO RELATED APPLICATIONS

The present invention claims priority of Korean patent application number(s) 10-2005-0107399, filed on Nov. 10, 2005 which is incorporated by reference in its entirety.

BACKGROUND OF THE INVENTION

The present invention relates to a semiconductor device and a method for fabricating the same, and more particularly, to a capacitor with a dielectric structure advantageous of reducing leakage current, and a method for fabricating the same.

As dielectric structures of capacitors for sub-60 nm dynamic random access memories (DRAMs), many researchers have attempted to form a thin layer of zirconium oxide ($ZrO_2$) using an atomic layer deposition (ALD) method. However, when an ALD method is used to form a thin layer of $ZrO_2$, $ZrO_2$ is usually crystallized at a low temperature of 300° C. Hence, if a single layer of $ZrO_2$ is used as a dielectric structure, current is likely to leak.

For this reason, a laminate structure including a $ZrO_2$ layer and an aluminum oxide ($Al_2O_3$) layer, which has high crystallization temperature, or an alloy including $ZrO_2$ and $Al_2O_3$ is applied to reduce the crystallization.

FIG. 1 illustrates a cross-sectional view of a conventional capacitor structure. The capacitor includes a lower electrode 11, a dielectric structure 12, and an upper electrode 13 formed in sequential order. The dielectric structure 12 includes amorphous thin $ZrO_2$ layer 12A and an amorphous thin $Al_2O_3$ layer 12B.

However, since the thin $ZrO_2$ layer and the thin $Al_2O_3$ layer are at amorphous phase, relative dielectric constants thereof are usually small. Thus, the thicknesses of the $ZrO_2$ layer and the $Al_2O_3$ layer need to be reduced to obtain a desired level of capacitance. In such a case, leakage current is likely to occur, and thus, the implementation of the aforementioned dielectric structure may become limited in actual practice.

SUMMARY OF THE INVENTION

Various embodiments of the present invention are directed to provide a capacitor suitable for a certain level of capacitance by improving a dielectric constant and a leakage current characteristic, and a method for fabricating the same.

In accordance with an aspect of the present invention, there is provided a capacitor, including a lower electrode, a dielectric structure over the lower electrode, the dielectric structure including at least one crystallized zirconium oxide ($ZrO_2$) layer and at least one amorphous aluminum oxide ($Al_2O_3$) layer, and an upper electrode formed over the dielectric structure.

In accordance with another aspect of the present invention, there is provided a capacitor, including a lower electrode, a dielectric structure formed over the lower electrode, the dielectric structure including at least one crystallized zirconium oxide ($ZrO_2$) layer and at least one amorphous zirconium aluminum oxide ($ZrAlO_x$) layer, where 'x' representing an atomic ratio of oxygen is a positive number, and an upper electrode.

In accordance with another aspect of the present invention, there is provided a method for fabricating a capacitor, the method including forming a lower electrode over a certain structure, forming a dielectric structure including at least one crystallized zirconium oxide ($ZrO_2$) layer and at least one amorphous aluminum oxide ($Al_2O_3$) layer over the lower electrode, and forming an upper electrode over the dielectric structure.

In accordance with a further another aspect of the present invention, there is provided a method for fabricating a capacitor, the method including forming a lower electrode over a certain structure, forming a dielectric structure including at least one crystallized zirconium oxide ($ZrO_2$) layer and at least one amorphous zirconium aluminum oxide ($ZrAlO_x$) layer, where 'x' representing an atomic ratio of oxygen is a positive number, over the lower electrode, and forming an upper electrode over the dielectric structure.

DESCRIPTION OF SPECIFIC EMBODIMENTS

Figure 1:
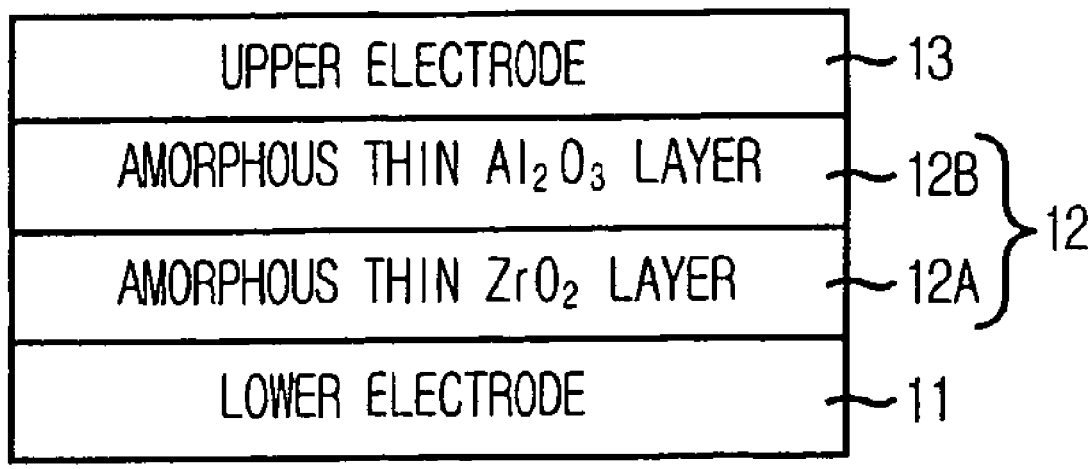
FIG. 1 illustrates a cross-sectional view of a conventional capacitor structure.
Figure 2A:
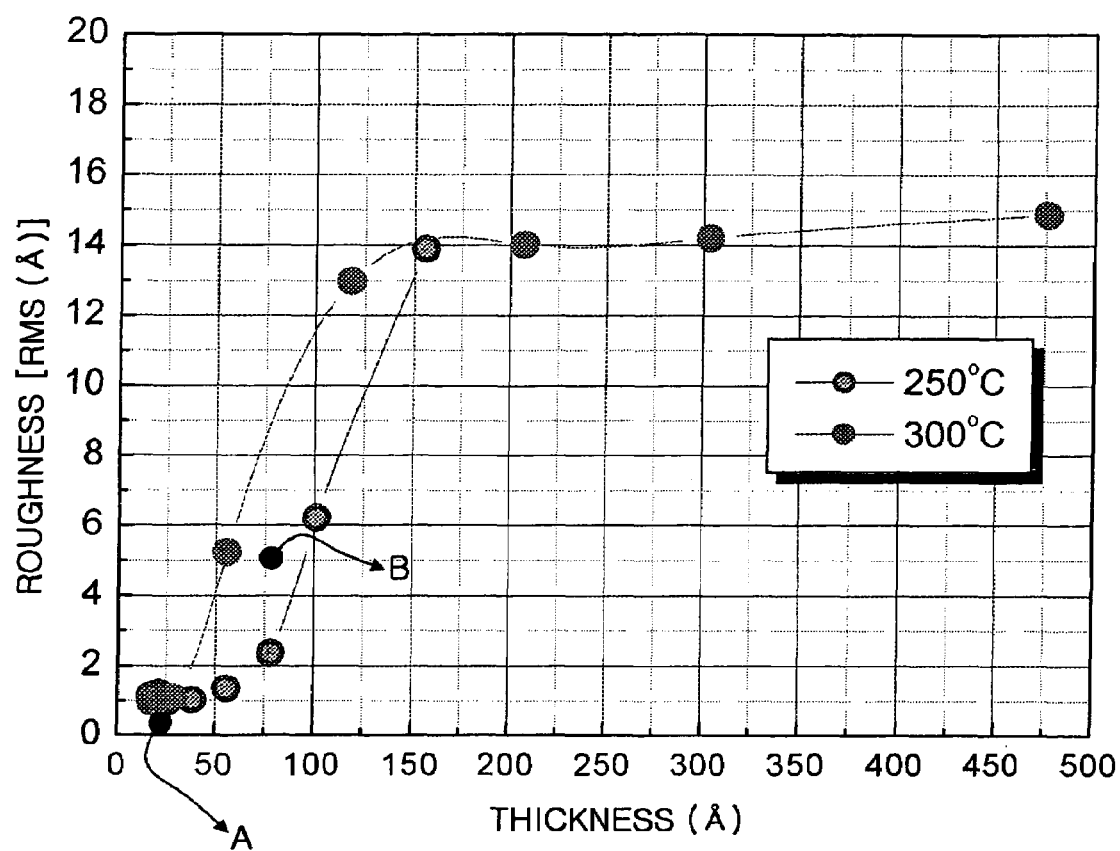
FIG. 2A illustrates a graph of surface roughness associated with the thickness of a zirconium oxide ($ZrO_2$) layer in accordance with an embodiment of the present invention.
Figure 2B:
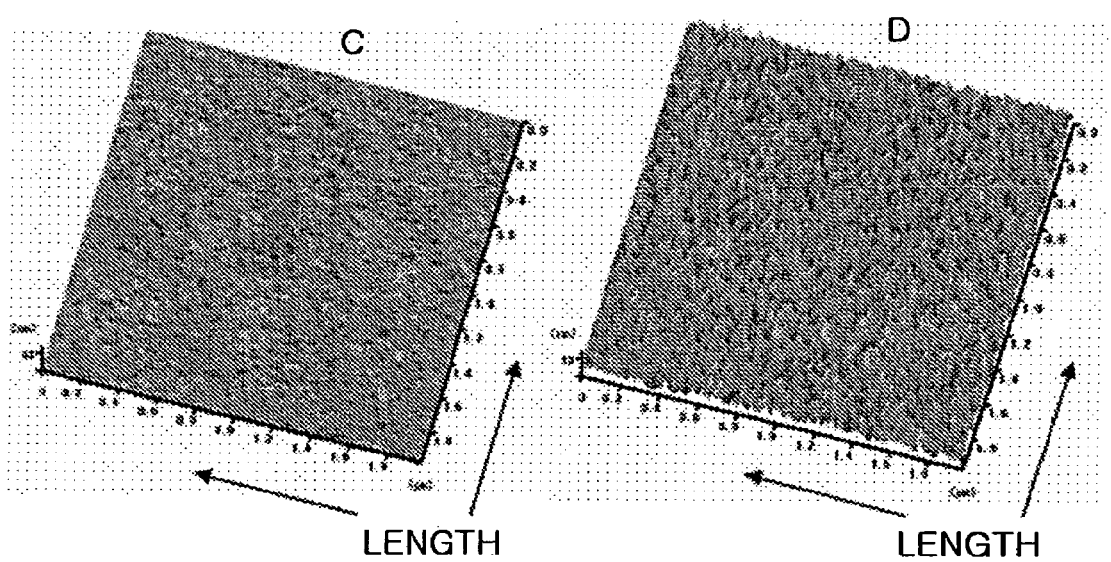
FIG. 2B illustrates transmission electron microscopic (TEM) images of a $ZrO_2$ layer with different levels of surface roughness at different phases in accordance with an embodiment of the present invention.

FIG. 2A illustrates a graph of surface roughness associated with the thickness of a zirconium oxide ($ZrO_2$) layer in accordance with an embodiment of the present invention. FIG. 2B illustrates transmission electron microscopic (TEM) images of a $ZrO_2$ layer with different levels of surface roughness at different phases in accordance with an embodiment of the present invention. Referring to FIG. 2A, the $ZrO_2$ layer is formed at approximately 300° C. using an atomic layer deposition (ALD) method, and the surface roughness of the $ZrO_2$ layer at different thicknesses is measured in the unit of root-mean-square (RMS). As the thickness of the $ZrO_2$ layer increases, the surface roughness thereof increases as well.

In more detail, when the $ZrO_2$ layer is approximately 45 Å thick, the surface roughness increases abruptly. This behavior is caused by the crystallization of $ZrO_2$, and the TEM images illustrated in FIG. 2B verify the $ZrO_2$ crystallization.

In the graph illustrated in FIG. 2A, reference label 'A' denotes the $ZrO_2$ layer at amorphous phase, while reference label 'B' denotes the $ZrO_2$ layer at crystalline phase. In particular, the graph illustrated in FIG. 2A and the TEM image illustrated in FIG. 2B (see 'C') show that the amorphous phase of the $ZrO_2$ layer (see 'A' in FIG. 2A) is observed at approximately 45 Å or less, and at this time, the $ZrO_2$ layer has a low dielectric constant. Also, when the thickness of the $ZrO_2$ layer is above approximately 45 Å, the $ZrO_2$ layer is crystallized (see 'B' in FIG. 2A) and has a high dielectric constant. The TEM image 'D' illustrated in FIG. 2B shows the $ZrO_2$ layer at crystalline phase.

However, although the $ZrO_2$ layer at amorphous phase has a low dielectric constant, this $ZrO_2$ layer can reduce leakage current since the $ZrO_2$ layer at amorphous phase does not have poor crystalline boundaries. On the other hand, although the $ZrO_2$ layer at crystalline phase has a high dielectric constant, this $ZrO_2$ layer is crystallized, often resulting in leakage current due to crystalline boundaries.

In the case of $Al_2O_3$, this crystallization does not occur till the temperature reaches approximately 900° C. since $Al_2O_3$ is usually crystallized at high temperature. Also, $Al_2O_3$ is generally not crystallized when the thickness of an $Al_2O_3$ layer ranges from approximately 200 Å to 300 Å, or above this thickness range. The appropriate application of such distinctive characteristics of $ZrO_2$ and $Al_2O_3$ at different phases allows formation of a dielectric structure with a high dielectric constant and low leakage current.

Figure 3:
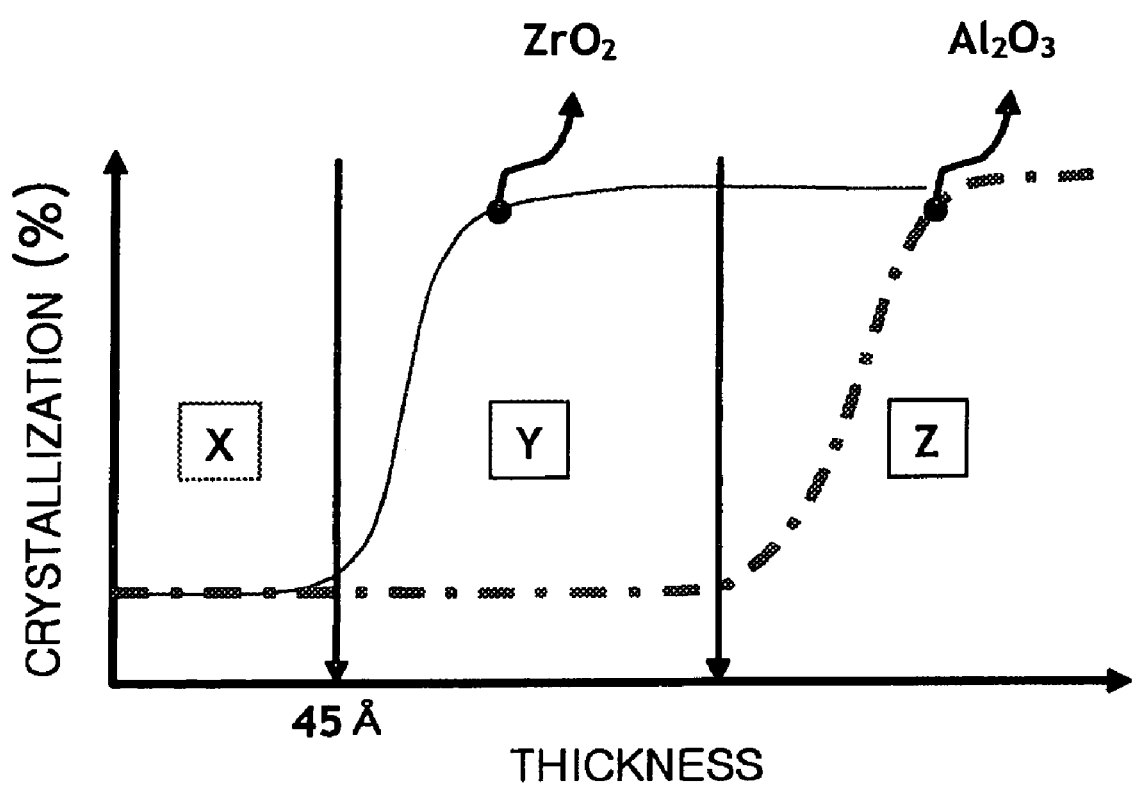
FIG. 3 illustrates a graph of a degree of crystallization associated with the thicknesses of $ZrO_2$ and aluminum oxide ($Al_2O_3$) layers in accordance with an embodiment of the present invention.

FIG. 3 illustrates a graph of a degree of crystallization associated with the thicknesses of $ZrO_2$ and $Al_2O_3$ layers in accordance with an embodiment of the present invention. In the graph, a 'X' region denotes the case where the $ZrO_2$ and $Al_2O_3$ layers are at amorphous phase. A 'Y' region denotes the case where the $ZrO_2$ layer is at crystalline phase while the $Al_2O_3$ layer is at amorphous phase. A 'Z' region denotes the case where the $ZrO_2$ and $Al_2O_3$ layers are at crystalline phase.

Since the $ZrO_2$ and $Al_2O_3$ layers are at amorphous phase and have respective dielectric constants given at amorphous phase, leakage current is not likely to occur due to the absence of poor crystalline boundaries despite of given low dielectric constants. In the 'Y' region, as mentioned above, the $ZrO_2$ layer is at crystalline phase, while the $Al_2O_3$ layer is at amorphous phase. Thus, when the $ZrO_2$ layer and the $Al_2O_3$ layer are laminated over each other, the $ZrO_2$ layer has a high dielectric constant, thereby allowing the dielectric constant of the dielectric structure to increase. Also, since the $Al_2O_3$ layer in the 'Y' region is still at amorphous phase, the $Al_2O_3$ layer can block the crystalline boundaries of the $ZrO_2$ layer. As a result, the leakage current can be reduced.

In the 'Z' region, since the $ZrO_2$ layer and the $Al_2O_3$ layer are crystallized, the dielectric constant of the dielectric structure is high. However, those crystalline boundaries prone to the leakage current are not blocked by the $ZrO_2$ layer or the $Al_2O_3$ layer, and thus, the leakage current is likely to increase. Accordingly, according to the embodiments of the present invention, the $ZrO_2$ layer at crystalline phase and the $Al_2O_3$ layer at amorphous phase discovered in the 'Y' region (i.e., high dielectric constant and low leakage current) are formed in a structure of dual, triple, multiple, or mixture layers to be used as the dielectric structure of the capacitor.

Figure 4A:
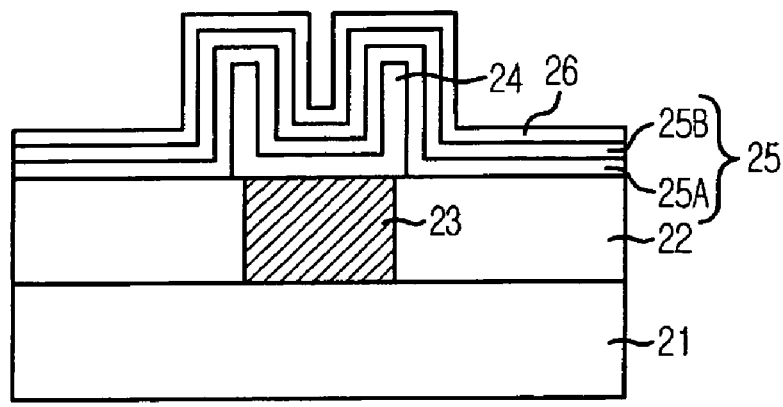
FIG. 4A illustrates a cross-sectional view of a capacitor structure in a semiconductor device in accordance with a first specific embodiment of the present invention.
Figure 4B:
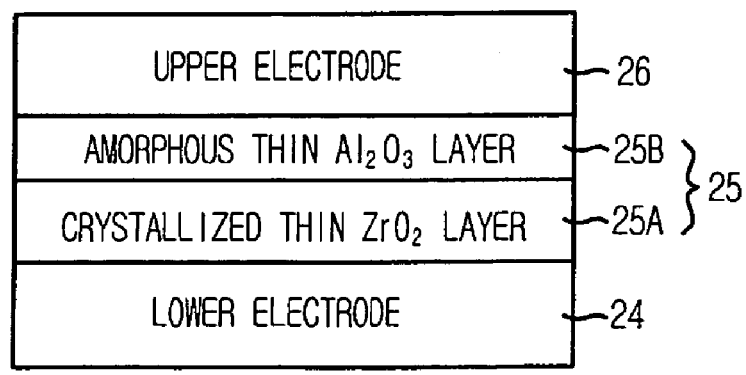
FIG. 4B illustrates a simplified diagram of a capacitor structure in accordance with the first specific embodiment of the present invention.

FIG. 4A illustrates a cross-sectional view of a capacitor structure in a semiconductor device in accordance with a first specific embodiment of the present invention. FIG. 4B illustrates a simplified diagram of a capacitor structure in accordance with the first specific embodiment of the present invention. A lower electrode 24 is formed over a bottom substrate structure including previously formed various elements (e.g., a substrate 21, an insulation layer 22, and a contact plug 23). A dual structure of a crystallized thin $ZrO_2$ layer 25A and an amorphous thin $Al_2O_3$ layer 25B laminated in this sequence order is formed as a dielectric structure 25 over the lower electrode 24. The crystallized $ZrO_2$ layer is formed to a thickness of approximately 40 Å to 150 Å, while the amorphous $Al_2O_3$ layer is formed to a thickness of approximately 2 Å to 20 Å. An upper electrode 26 is then formed over the dielectric structure 25. This dual structure of the crystallized $ZrO_2$ layer 25A and the amorphous $Al_2O_3$ layer 25B allows achieving a high dielectric constant in a range of approximately 40 due to the crystallized thin $ZrO_2$ layer 25A and reducing the leakage current due to the amorphous thin $Al_2O_3$ layer 25B. The high dielectric constant can contribute to improvement in large capacitance of the capacitor.

Figure 5:
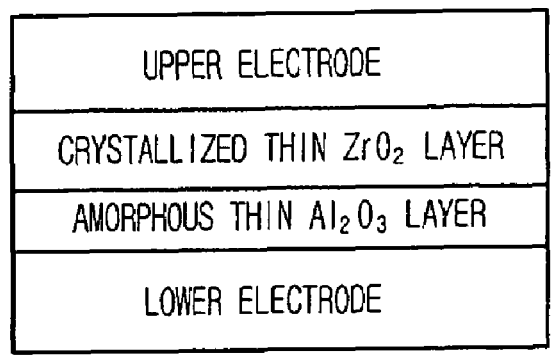
FIG. 5 illustrates a simplified diagram of a capacitor structure in accordance with a second specific embodiment of the present invention.

FIG. 5 illustrates a simplified diagram of a capacitor structure in accordance with a second specific embodiment of the present invention. A dual structure of an amorphous thin $Al_2O_3$ layer and a crystallized thin $ZrO_2$ layer laminated in this sequence order is formed as a dielectric structure over a lower electrode. The amorphous $Al_2O_3$ layer is formed to a thickness of approximately 2 Å to 20 Å, while the crystallized $ZrO_2$ layer is formed to a thickness of approximately 40 Å to 150 Å. An upper electrode is then formed over the dielectric structure. This dual structure of the amorphous $Al_2O_3$ layer and the crystallized $ZrO_2$ layer allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor.

Figure 6:
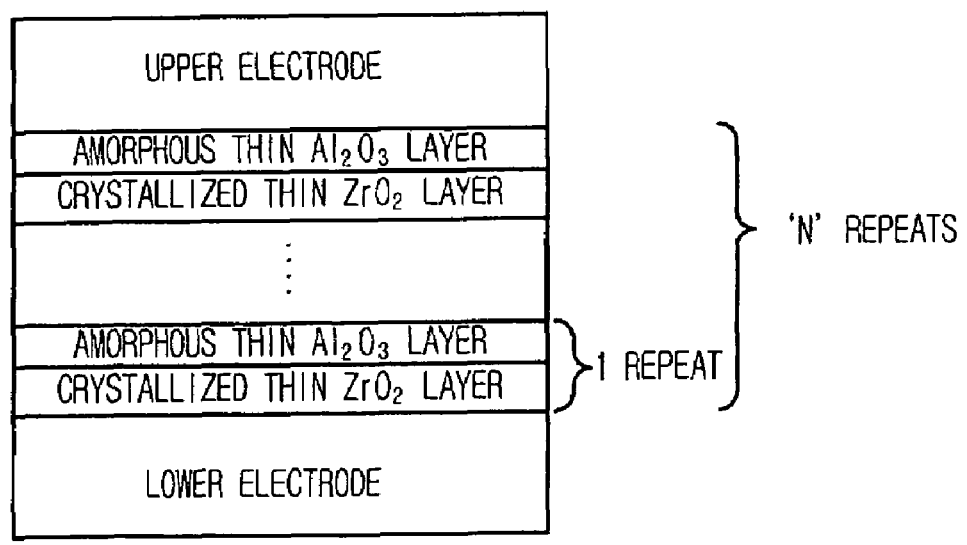
FIG. 6 illustrates a simplified diagram of a capacitor structure in accordance with a third specific embodiment of the present invention.

FIG. 6 illustrates a simplified diagram of a capacitor structure in accordance with a third specific embodiment of the present invention. A dielectric structure including repeatedly formed dual structures is formed over a lower electrode. Each dual structure includes a crystallized thin $ZrO_2$ layer and an amorphous thin $Al_2O_3$ layer laminated in sequence order. The dual structures are repeatedly formed for a certain number of times N, where N may range from approximately 2 to 10. The crystallized $ZrO_2$ layer is formed to a thickness of approximately 40 Å to 150 Å, while the amorphous $Al_2O_3$ layer is formed to a thickness of approximately 2 Å to 20 Å. An upper electrode is then formed over the dielectric structure. This dielectric structure including the repeatedly formed dual structures of the crystallized $ZrO_2$ layer and the amorphous $Al_2O_3$ layer allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor.

Figure 7:
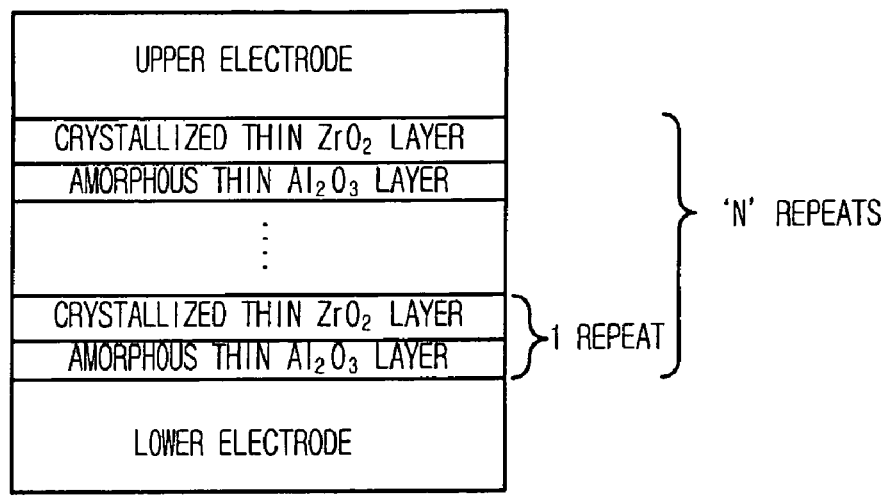
FIG. 7 illustrates a simplified diagram of a capacitor structure in accordance with a fourth specific embodiment of the present invention.

FIG. 7 illustrates a simplified diagram of a capacitor structure in accordance with a fourth specific embodiment of the present invention. A dielectric structure including repeatedly formed dual structures is formed over a lower electrode. Each dual structure includes an amorphous thin $Al_2O_3$ layer and a crystallized thin $ZrO_2$ layer laminated in sequence order. The dual structures are repeatedly formed for a certain number of times N, where N may range from approximately 2 to 10. The amorphous thin $Al_2O_3$ layer is formed to a thickness of approximately 2 Å to 20 Å, while the crystallized thin $ZrO_2$ layer is formed to a thickness of approximately 40 Å to 150 Å. This dielectric structure including the repeatedly formed dual structures of the amorphous $Al_2O_3$ layer and the crystallized $ZrO_2$ layer allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor.

Figure 8:
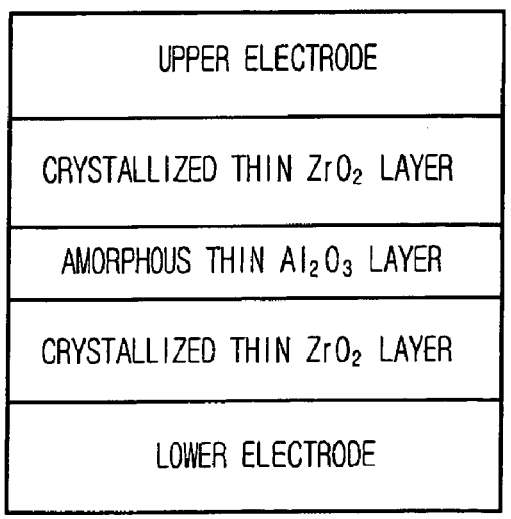
FIG. 8 illustrates a simplified diagram of a capacitor structure in accordance with a fifth specific embodiment of the present invention.

FIG. 8 illustrates a simplified diagram of a capacitor structure in accordance with a fifth specific embodiment of the present invention. A triple structure including a crystallized thin $ZrO_2$ layer, an amorphous thin $Al_2O_3$ layer, and another crystallized thin $ZrO_2$ layer laminated in this sequence order is formed as a dielectric structure over a lower electrode. The crystallized $ZrO_2$ layer is formed to a thickness of approximately 40 Å to 150 Å, while the amorphous $Al_2O_3$ layer is formed to a thickness of approximately 2 Å to 20 Å. This triple structure including the crystallized $ZrO_2$ layer, the amorphous $Al_2O_3$ layer, and the other crystallized $ZrO_2$ allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor.

Figure 9:
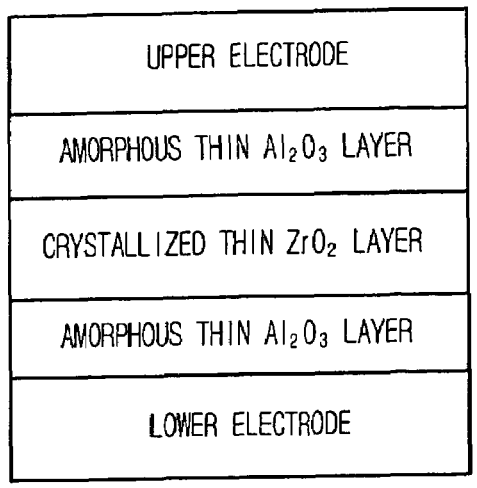
FIG. 9 illustrates a simplified diagram of a capacitor structure in accordance with a sixth specific embodiment of the present invention.

FIG. 9 illustrates a simplified diagram of a capacitor structure in accordance with a sixth specific embodiment of the present invention. A triple structure including an amorphous thin $Al_2O_3$ layer, a crystallized thin $ZrO_2$ layer, and another amorphous thin $Al_2O_3$ layer laminated in this sequence order is formed as a dielectric structure over a lower electrode. The amorphous $Al_2O_3$ layer is formed to a thickness of approximately 2 Å to 20 Å, while the crystallized $ZrO_2$ layer is formed to a thickness of approximately 40 Å to 150 Å. This triple structure including the amorphous $Al_2O_3$ layer, the crystallized $ZrO_2$ layer, and the other amorphous $Al_2O_3$ layer allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor.

Figure 10:
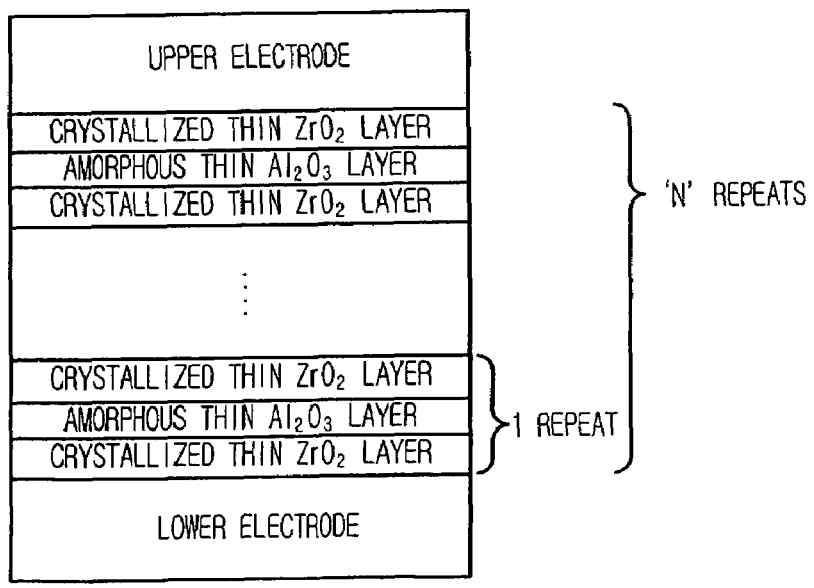
FIG. 10 illustrates a simplified diagram of a capacitor structure in accordance with a seventh specific embodiment of the present invention.

FIG. 10 illustrates a simplified diagram of a capacitor structure in accordance with a seventh specific embodiment of the present invention. A dielectric structure including repeatedly formed triple structures is formed over a lower electrode. Each triple structure includes a crystallized thin $ZrO_2$ layer, an amorphous thin $Al_2O_3$ layer, and another a crystallized thin $ZrO_2$ layer laminated in sequence order. The triple structures are repeatedly formed for a certain number of times N, where N may range from approximately 2 to 10. The amorphous $Al_2O_3$ layer is formed to a thickness of approximately 2 Å to 20 Å, while the crystallized $ZrO_2$ layer is formed to a thickness of approximately 40 Å to 150 Å. This dielectric structure including the repeatedly formed triple structures including the crystallized $ZrO_2$ layer, the amorphous $Al_2O_3$ layer, and the other crystallized $ZrO_2$ layer allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor.

Figure 11:
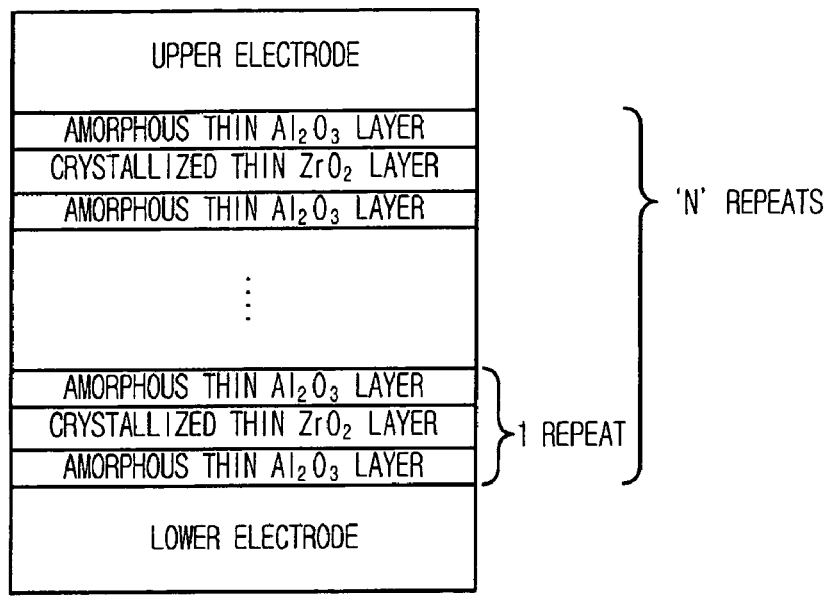
FIG. 11 illustrates a simplified diagram of a capacitor structure in accordance with an eighth specific embodiment of the present invention.

FIG. 11 illustrates a simplified diagram of a capacitor structure in accordance with an eighth specific embodiment of the present invention. A dielectric structure including repeatedly formed triple structures is formed over a lower electrode. Each triple structure includes an amorphous thin $Al_2O_3$ layer, a crystallized thin $ZrO_2$ layer, and another amorphous thin $Al_2O_3$ layer laminated in this sequence. The triple structures are repeatedly formed for a certain number of times N, where N may range from approximately 2 to 10. The amorphous $Al_2O_3$ layer is formed to a thickness of approximately 2 Å to 20 Å, while the crystallized $ZrO_2$ layer is formed to a thickness of approximately 40 Å to 150 Å. This triple structure including the amorphous $Al_2O_3$ layer, the crystallized $ZrO_2$ layer, the other amorphous $Al_2O_3$ layer allows achieving a high dielectric constant in a range of approximately 40 due to the crystallized thin $ZrO_2$ layer and reducing the leakage current due to the amorphous thin $Al_2O_3$ layer. The high dielectric constant can contribute to improvement in large capacitance of the capacitor. The dielectric structures described in FIGS. 4 to 11 are formed using an ALD method.

Figure 12:
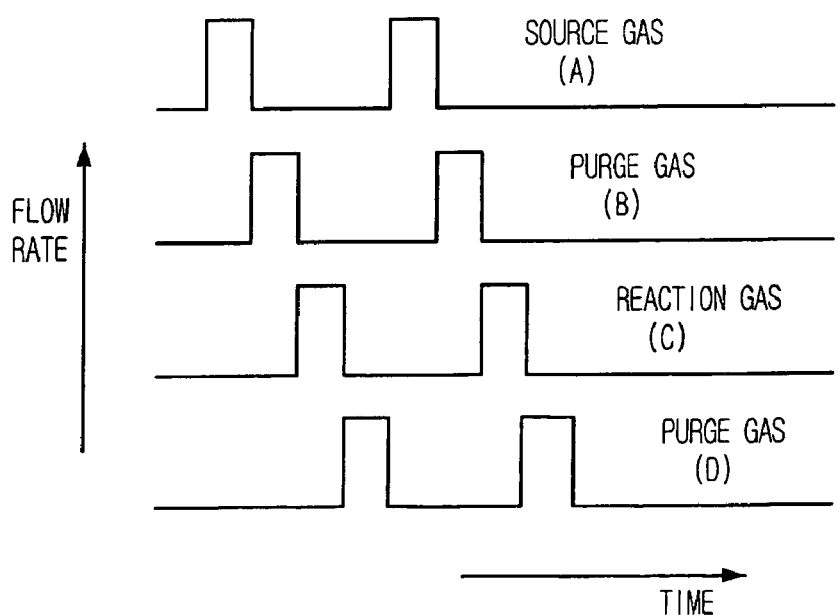
FIG. 12 is a simplified diagram to illustrate an atomic layer deposition (ALD) method implemented for providing the capacitor structures in accordance with the first to eighth specific embodiments of the present invention.

FIG. 12 illustrates a diagram to illustrate an ALD method for forming a dielectric structure in accordance with the first to eighth specific embodiments of the present invention. The diagram illustrates a series of mechanism for depositing a dielectric structure using the ALD method.

A typical ALD method includes performing four steps. A first step (A) includes loading a wafer in a chamber and supplying a source gas into the chamber. A second step (B) includes supplying a purge gas into the chamber. A third step (C) includes supplying a reaction gas into the chamber. A fourth step (D) includes supplying a purge gas into the chamber.

The first step (A) includes supplying a source gas into a target chamber. In detail, a wafer is loaded in a deposition chamber, and the source gas including a zirconium (Zr) source material or aluminum (Al) source material is supplied into the chamber. Thus, the source gas is adsorbed on the wafer.

The source gas is chemically adsorbed on the wafer, and consequently, a source gas layer is formed over the wafer. The Zr source may utilize a precursor including one selected from a group consisting of $Zr(O-tBu)_4$, $Zr[N(CH_3)_2]_4$, $Zr[N(C_2H_5)CH_3]_4$, $Zr[N(C_2H_5)_2]_4$, $Zr(TMHD)_4$, $Zr(OiC_3H_7)_3(TMHD)$, and a combination thereof.

The second step (B) includes supplying a purge gas into a target chamber. In detail, the purge gas is supplied into the target chamber to remove parts of the source gas loosely bonded to the source gas layer formed over the wafer or non-reacted parts of the source gas. Thus, only the source gas layer having a uniform surface is formed over the wafer. The purge gas is an inert gas, and may include one selected from a group consisting of argon (Ar), helium (He), nitrogen ($N_2$) and a combination thereof.

The third step (C) includes supplying a reaction gas into the chamber. The reaction gas may include one selected from a group consisting of ozone ($O_3$), oxygen ($O_2$) plasma, and water ($H_2O$).

The reaction gas is supplied into the chamber and induces a reaction between the source gas layer and the reaction gas to form a zirconium dioxide ($ZrO_2$) layer. Thus, a material layer at an atomic layer level is formed over the wafer. That is, the $ZrO_2$ layer is formed over the wafer through the reaction between the source gas layer and the reaction gas.

The fourth step (D) includes supplying a purge gas into the chamber. The purge gas is supplied into the chamber to remove non-reacted parts of the reaction gas and reaction by-products. Consequently, the $ZrO_2$ layer is formed evenly over the wafer. The purge gas is an inert gas, and may include one selected from a group consisting of Ar, He, $N_2$ and a combination thereof.

Accordingly, an atomic layer having a desired thickness is obtained by repeatedly performing a unit cycle including supplying the source gas (the first step), supplying the purge gas (the second step), supplying the reaction gas (the third step), and supplying the purge gas (the fourth step).

Meanwhile, the ALD method uses one of a single-wafer type apparatus and a batch type furnace. A temperature ranging from approximately 200° C. to approximately 350° C. is maintained in the chamber when the single-wafer type apparatus is used.

An aluminum oxide ($Al_2O_3$) layer is formed over the $ZrO_2$ layer using an ALD method. FIG. 12 is also used to describe this process since the embodying fundamentals are substantially the same.

A first step (A) includes loading a wafer in a chamber and supplying a source gas into the chamber. A second step (B) includes supplying a purge gas into the chamber. A third step (C) includes supplying a reaction gas into the chamber. A fourth step (D) includes supplying a purge gas into the chamber.

The first step (A) includes supplying a source gas into a target chamber. A wafer is loaded in a deposition chamber, and the source gas including an aluminum (Al) source material is supplied into the chamber. Thus, the source gas is adsorbed on the wafer.

The source gas is chemically adsorbed on the wafer, and consequently, a source gas layer is formed over the wafer. The Al source may utilize a precursor including $Al(CH_3)_3$.

The second step (B) includes supplying a purge gas into the chamber. The purge gas is supplied into the chamber to remove parts of the source gas loosely bonded to the source gas layer formed over the wafer or non-reacted parts of the source gas. Thus, only the source gas layer having a uniform surface is formed over the wafer. The purge gas is an inert gas, and may include one selected from a group consisting of Ar, He, $N_2$, and a combination thereof.

The third step (C) includes supplying a reaction gas into the chamber. The reaction gas may include one selected from a group consisting of ozone ($O_3$), oxygen ($O_2$) plasma, and water ($H_2O$).

The reaction gas is supplied into the chamber and induces a reaction between the source gas layer and the reaction gas to form an $Al_2O_3$ layer. Thus, a material layer at an atomic layer level is formed over the wafer. That is, the $Al_2O_3$ layer is formed over the wafer through the reaction between the source gas layer and the reaction gas.

The fourth step (D) includes supplying a purge gas into the chamber. The purge gas is supplied into the chamber to remove non-reacted oxygen source and reaction by-products. Consequently, the $Al_2O_3$ layer is formed evenly over the wafer. The purge gas is an inert gas, and may include one selected from a group consisting of Ar, He, $N_2$, and a combination thereof.

Accordingly, an atomic layer having a desired thickness is obtained by repeatedly performing a unit cycle including supplying the source gas (the first step), supplying the purge gas (the second step), supplying the reaction gas (the third step), and supplying the purge gas (the fourth step). At this time, a substrate temperature is maintained to range from approximately 100° C. to approximately 500° C.

A thermal treatment is performed to form a crystallized $ZrO_2$ layer or to increase the crystallization of the $ZrO_2$ layer. The thermal treatment on the thin layer is performed at a temperature ranging from approximately 500° C. to approximately 800° C. in an atmosphere of $N_2$ or Ar with a controlled oxygen quantity or in a vacuum.

The thermal treatment is performed using one of a furnace thermal treatment and a rapid thermal treatment. Meanwhile, the ALD method utilizes one of a single-wafer type apparatus and a batch type furnace.

Figure 13:
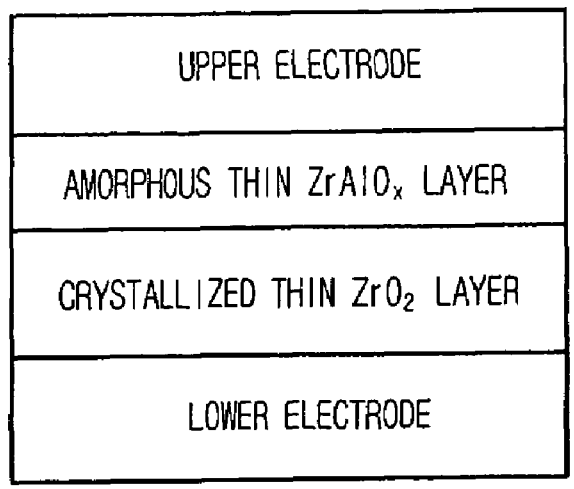
FIG. 13 illustrates a simplified diagram of a capacitor structure in accordance with a ninth specific embodiment of the present invention.

FIG. 13 illustrates a simplified diagram of a capacitor structure in accordance with a ninth specific embodiment of the present invention. A dual structure of a crystallized thin $ZrO_2$ layer and an amorphous thin $ZrAlO_x$ layer laminated in this sequence order is formed as a dielectric structure over a lower electrode. The crystallized $ZrO_2$ layer is formed to a thickness of approximately 40 Å to 150 Å, while the amorphous $ZrAlO_x$ layer is formed to a thickness of approximately 2 Å to 20 Å. This dual structure of the crystallized $ZrO_2$ layer and the amorphous $ZrAlO_x$ layer allows achieving a high dielectric constant in a range of approximately 40 due to the crystallized thin $ZrO_2$ layer and reducing the leakage current due to the amorphous thin $ZrAlO_x$ layer. The high dielectric constant can contribute to improvement in large capacitance of the capacitor.

Figure 14:
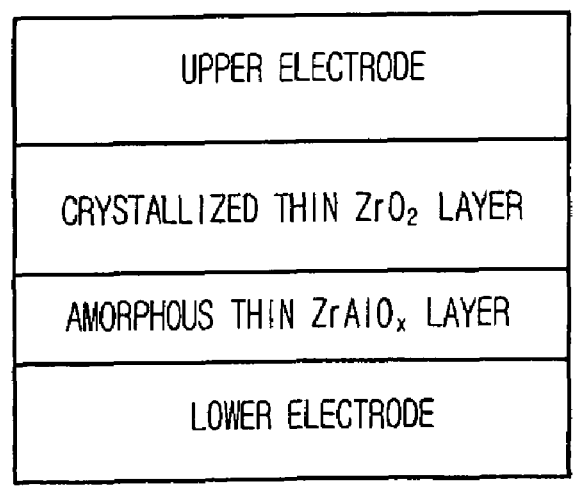
FIG. 14 illustrates a simplified diagram of a capacitor structure in accordance with a tenth specific embodiment of the present invention.

FIG. 14 illustrates a simplified diagram of a capacitor structure in accordance with a tenth specific embodiment of the present invention. A dual structure of an amorphous thin $ZrAlO_x$ layer and a crystallized thin $ZrO_2$ layer laminated in this sequence order is formed as a dielectric structure over a lower electrode. The amorphous $ZrAlO_x$ layer is formed to a thickness of approximately 2 Å to 20 Å, while the crystallized $ZrO_2$ layer is formed to a thickness of approximately 40 Å to 150 Å. This dual structure of the amorphous $ZrAlO_x$ layer and the crystallized $ZrO_2$ layer allows achieving a high dielectric constant in a range of approximately 40 due to the crystallized thin $ZrO_2$ layer and reducing the leakage current due to the amorphous thin $ZrAlO_x$ layer. The high dielectric constant can contribute to improvement in large capacitance of the capacitor. The crystallized $ZrO_2$ layer and the amorphous $ZrAlO_x$ layer illustrated in FIGS. 13 and 14 are formed by employing an ALD method.

Figure 15:
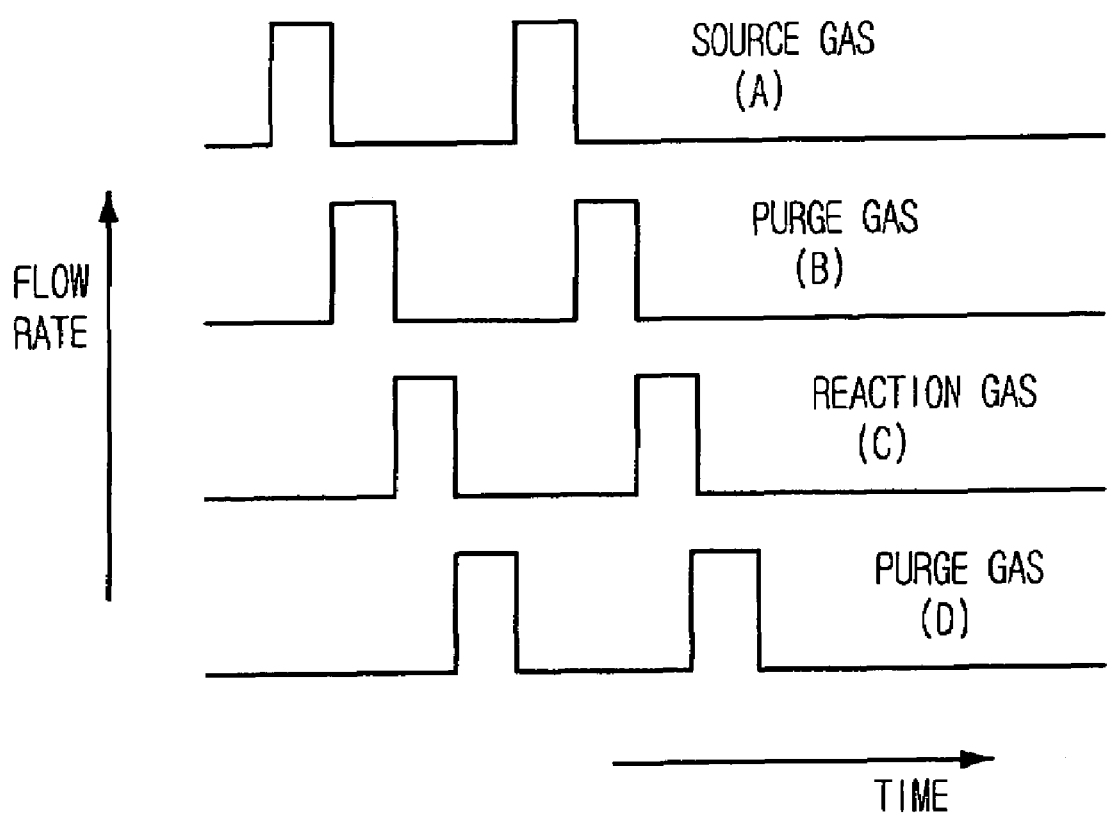
FIG. 15 is a simplified diagram to illustrate an ALD method implemented for providing the capacitor structures in accordance with the ninth to tenth specific embodiments of the present invention.

FIG. 15 illustrates a diagram to illustrate an ALD method in accordance with the ninth and tenth specific embodiments of the present invention. The diagram illustrates a series of mechanism for depositing a dielectric structure using the ALD method.

A typical ALD method includes performing four steps. A first step (A) includes loading a wafer in a chamber and supplying a source gas into the chamber. A second step (B) includes supplying a purge gas into the chamber. A third step (C) includes supplying a reaction gas into the chamber. A fourth step (D) includes supplying a purge gas into the chamber.

The first step (A) includes supplying a source gas into a target chamber. In detail, a wafer is loaded in a deposition chamber, and the source gas including Zr source or Al source is supplied into the chamber. Thus, the source gas is adsorbed on the wafer.

The source gas is chemically adsorbed on the wafer, and consequently, a source gas layer is formed over the wafer. The Zr source may utilize a precursor including one selected from a group consisting of $Zr(O\text{-}tBu)_4$, $Zr[N(CH_3)_2]_4$, $Zr[N(C_2H_5)CH_3]_4$, $Zr[N(C_2H_5)_2]_4$, $Zr(TMHD)_4$, $Zr(OiC_3H_7)_3(TMHD)$, and a combination thereof. The Al source may utilize a precursor including Al $(CH_3)$ 3.

The second step (B) includes supplying a purge gas into the chamber. The purge gas is supplied into the chamber to remove parts of the source gas loosely bonded to the source gas layer formed over the wafer or non-reacted parts of the source gas. Thus, only the source gas layer having a uniform surface is formed over the wafer. The purge gas is an inert gas, and may include one selected from a group consisting of Ar, He, $N_2$, and a combination thereof.

The third step (C) includes supplying a reaction gas into the chamber. The reaction gas may include one selected from a group consisting of $O_3$, $O_2$ plasma, and $H_2O$.

The reaction gas is supplied into the chamber and induces a reaction between the source gas layer and the reaction gas to form a $ZrAlO_x$ layer, where 'x' representing an atomic ratio of oxygen is a certain positive number. Thus, a material layer at an atomic layer level is formed over the wafer. That is, the $ZrAlO_x$ layer is formed over the wafer through the reaction between the source gas layer and the reaction gas.

The fourth step (D) includes supplying a purge gas into the chamber. The purge gas is supplied into the chamber to remove non-reacted parts of oxygen gas and reaction by-products. Consequently, the $ZrAlO_x$ layer is formed evenly over the wafer. The purge gas is an inert gas, and may include one selected from a group consisting of Ar, He, $N_2$, and a combination thereof.

Accordingly, an atomic layer having a desired thickness is obtained by repeatedly performing a unit cycle including supplying the source gas (the first step), supplying the purge gas (the second step), supplying the reaction gas (the third step), and supplying the purge gas (the fourth step).

A thermal treatment is performed to form a crystallized $ZrO_2$ layer or to increase the crystallization of the $ZrO_2$ layer. The thermal treatment is performed at a temperature ranging from approximately 500° C. to approximately 800° C. after a dielectric structure is formed.

The thermal treatment is performed using one of a furnace thermal treatment and a rapid thermal treatment. Meanwhile, the ALD method utilizes one of a single-wafer type apparatus and a batch type furnace.

In accordance with the specific embodiments, forming a capacitor using the dielectric structure including the crystallized $ZrO_2$ layer and the amorphous $Al_2O_3$ layer may allow increasing the dielectric constant of the capacitor while decreasing the leakage current. Thus, characteristics of the capacitor may be improved. Although the $ZrO_2$ layer is used as the crystallized material in the specific embodiments of the present invention, a crystallized hafnium dioxide $(HfO_2)$ layer or a crystallized lanthanum trioxide $(La_2O_3)$ layer may be used as the crystallized material.

In accordance with the specific embodiments, the characteristics of the capacitor may be improved by maintaining the crystallization of the $ZrO_2$ layer, which is a high-k dielectric layer, and increasing the dielectric constant by employing the amorphous $Al_2O_3$ layer as a part of the laminate structure, while decreasing the leakage current characteristic.

While the present invention has been described with respect to the specific embodiments, it will be apparent to those skilled in the art that various changes and modifications may be made without departing from the spirit and scope of the invention as defined in the following claims.

What is claimed is:

1. A capacitor comprising:
   a lower electrode;
   a dielectric structure over the lower electrode, the dielectric structure including at least one crystallized zirconium oxide $(ZrO_2)$ layer having a first thickness and at least one amorphous aluminum oxide $(Al_2O_3)$ layer having a second thickness; and
   an upper electrode formed over the dielectric structure,
   wherein the first thickness is different from the second thickness, and the first thickness is greater than the second thickness.

2. The capacitor of claim 1, wherein the dielectric structure is formed in a dual structure by sequentially laminating the crystallized $ZrO_2$ layer and the amorphous $Al_2O_3$ layer over the lower electrode.

3. The capacitor of claim 1, wherein the dielectric structure is formed in a dual structure by sequentially laminating the amorphous $Al_2O_3$ layer and the crystallized $ZrO_2$ layer over the lower electrode.

4. The capacitor of claim 1, wherein the dielectric structure is formed in a triple structure by sequentially laminating the crystallized $ZrO_2$ layer, the amorphous $Al_2O_3$ layer and another crystallized $ZrO_2$ layer over the lower electrode.

5. The capacitor of claim 1, wherein the dielectric structure is formed in a triple structure by sequentially laminating the amorphous $Al_2O_3$ layer, the crystallized $ZrO_2$ layer, and another amorphous $Al_2O_3$ layer over the lower electrode.

6. The capacitor of claim 1, wherein the dielectric structure is formed in a multiple layers structure by alternately laminating the crystallized $ZrO_2$ layer and the amorphous $Al_2O_3$ layer 'n' times, where 'n' ranges from approximately 2 to 10.

7. The capacitor of claim 1, wherein the dielectric structure is formed in a multiple layers structure by alternately laminating the amorphous $Al_2O_3$ layer and the crystallized $ZrO_2$ layer 'm' times, where 'm' ranges from approximately 2 to 10.

8. The capacitor of claim 1, wherein the first thickness is approximately 40 Å to 150 Å.

9. The capacitor of claim 1, wherein the second thickness is approximately 2 Å to 20 Å.

10. The capacitor of claim 1, wherein the crystallized $ZrO_2$ layer and the amorphous $Al_2O_3$ layer are formed through performing an atomic layer deposition (ALD) method.

11. A method for fabricating a capacitor, the method comprising:
    forming a lower electrode over a certain structure;
    forming a dielectric structure including at least one crystallized zirconium oxide $(ZrO_2)$ layer having a first thickness and at least one amorphous aluminum oxide $(Al_2O_3)$ layer having a second thickness over the lower electrode; and
    forming an upper electrode over the dielectric structure,
    wherein the dielectric structure includes at least one crystallized $ZrO_2$ layer and at least one amorphous $Al_2O_3$ layer and is formed by performing a unit cycle a specified number of times, the unit cycle comprising supplying a source gas, supplying a purge gas, supplying a reaction gas, and supplying a purge gas,
    wherein the first thickness is different from the second thickness, and the first thickness is greater than the second thickness.

12. The method of claim 11, wherein forming the dielectric structure comprises forming a dual structure by sequentially laminating the crystallized $ZrO_2$ layer and the amorphous $Al_2O_3$ layer over the lower electrode.

13. The method of claim 11, wherein forming the dielectric structure comprises forming a dual structure by sequentially laminating the amorphous $Al_2O_3$ layer and the crystallized $ZrO_2$ layer over the lower electrode.

14. The method of claim 11, wherein forming the dielectric structure comprises forming a triple structure by sequentially laminating the crystallized $ZrO_2$ layer, the amorphous $Al_2O_3$ layer and another crystallized $ZrO_2$ layer over the lower electrode.

15. The method of claim 11, wherein forming the dielectric structure comprises forming a triple structure by sequentially laminating the amorphous $Al_2O_3$ layer, the crystallized $ZrO_2$ layer, and another amorphous $Al_2O_3$ layer over the lower electrode.

16. The method of claim 11, wherein forming the dielectric structure comprises forming a multiple layers structure by alternately and repeatedly laminating the crystallized $ZrO_2$ layer and the amorphous $Al_2O_3$ layer.

17. The method of claim 16, wherein forming the multiple layers structure by alternately and repeatedly laminating the crystallized $ZrO_2$ layer and the amorphous $Al_2O_3$ layer comprises repeating the alternate lamination approximately 2 to 10 times.

18. The method of claim 11, wherein forming the dielectric structure comprises forming a multiple layers structure by alternately and repeatedly laminating the amorphous $Al_2O_3$ layer and the crystallized $ZrO_2$ layer.

19. The method of claim 18, wherein forming the multiple layers structure by alternately and repeatedly laminating the amorphous $Al_2O_3$ layer and the crystallized $ZrO_2$ layer comprises repeating the alternate lamination approximately 2 to 10 times.

20. The method of claim 11, wherein the first thickness is approximately 40 Å to 150 Å.

21. The method of claim 11, wherein the second thickness is approximately 2 Å to 20 Å.

22. The method of claim 11, wherein forming the dielectric structure including the crystallized $ZrO_2$ layer and the amorphous $Al_2O_3$ layer comprise performing an atomic layer deposition (ALD) method.

23. The method of claim 11, wherein the crystallized $ZrO_2$ layer is formed by performing a unit cycle a certain number of times, the unit cycle comprising:
   adsorbing a Zr source on a target;
   purging out non-adsorbed parts of the Zr source;
   supplying a reaction gas to react with the adsorbed Zr source, thereby forming an atomic layer of $ZrO_2$; and
   purging out non-reacted parts of the reaction gas and by-products of the reaction.

24. The method of claim 23, wherein adsorbing the Zr source comprises using one precursor of the Zr source selected from a group consisting of $Zr(O-tBu)_4$, $Zr[N(CH_3)_2]_4$, $Zr[N(C_2H_5)CH_3]_4$, $Zr[N(C_2H_5)_2]_4$, $Zr(TMHD)_4$, $Zr(OiC_3H_7)_3(TMHD)$, and a combination thereof, and maintaining a substrate temperature in a range of approximately 200° C. to approximately 350° C.

25. The method of claim 23, wherein supplying the reaction gas comprises using one selected from a group consisting of $O_3$, $O_2$ plasma and $H_2O$.

26. The method of claim 23, wherein purging out the non-adsorbed parts of the Zr source comprises using one selected from a group consisting of helium (He), nitrogen ($N_2$), argon (Ar), and a combination thereof.

27. The method of claim 11, wherein the amorphous $Al_2O_3$ layer is formed by performing a unit cycle a certain number of times, the unit cycle comprises:
   adsorbing an Al source on a target;
   purging out non-adsorbed parts of the Al source;
   supplying a reaction gas to react with the adsorbed Al source, thereby forming an atomic layer of $Al_2O_3$; and
   purging out non-reacted parts of the reaction gas and by-products of the reaction.

28. The method of claim 27, wherein adsorbing the Al source comprises using $Al(CH_3)_3$ as a precursor of the Al source, and maintaining a substrate temperature in a range of approximately 100° C. to 500° C.

29. The method of claim 27, wherein supplying the reaction gas comprises using one selected from a group consisting of $O_3$, $O_2$ plasma and $H_2O$.

30. The method of claim 27, wherein purging out the non-adsorbed parts of the Al source comprises using one selected from a group consisting of He, $N_2$, Ar, and a combination thereof.

31. The method of claim 11, further comprising, after forming the dielectric structure, performing one of a rapid thermal treatment and a furnace thermal treatment at approximately 500° C. to 800° C. and an atmosphere of $N_2$, Ar or vacuum.

32. The method of claim 11, wherein the dielectric structure is formed by employing one of a single-wafer type apparatus and a batch type furnace.

* * * * *